United States Patent [19]

Engberg et al.

[11] 4,305,633
[45] Dec. 15, 1981

[54] ELECTRICAL CIRCUIT MODULE WITH SEQUENTIALLY ACTUATED CONTACT APPARATUS

[75] Inventors: Kjell Engberg; Björn Ericson, both of Västerås, Sweden

[73] Assignee: ASEA Aktiebolag, Västerås, Sweden

[21] Appl. No.: 87,834

[22] Filed: Oct. 24, 1979

[30] Foreign Application Priority Data

Nov. 1, 1978 [SE] Sweden ................................ 7811330

[51] Int. Cl.³ .............................................. H01R 13/62
[52] U.S. Cl. ............................ 339/17 LC; 339/45 M; 339/78; 339/110 R
[58] Field of Search ............... 339/14 P, 17 L, 17 LC, 339/17 LM, 17 M, 45 R, 45 M, 46, 64 R, 64 M, 65, 76–78, 92 R, 92 M, 93 R, 154 R, 156 R, 176 M, 108, 110

[56] References Cited

U.S. PATENT DOCUMENTS 3,914,565 10/1975 Niedermeyer ................... 339/14 P

FOREIGN PATENT DOCUMENTS 333245 8/1930 United Kingdom .............. 339/14 P

Primary Examiner—Neil Abrams
Attorney, Agent, or Firm—Pollock, Vande Sande & Priddy

[57] ABSTRACT

An electrical circuit module having sequentially actuated contact apparatus comprises at least two multiple contact devices (10, 11), each intended to be connected to a fixed contact device in an associated support frame, one of the multiple contact devices (11) having a larger play in the insertion direction relative to the module support plate (13), than does any other multiple contact device (FIG. 2).

4 Claims, 2 Drawing Figures

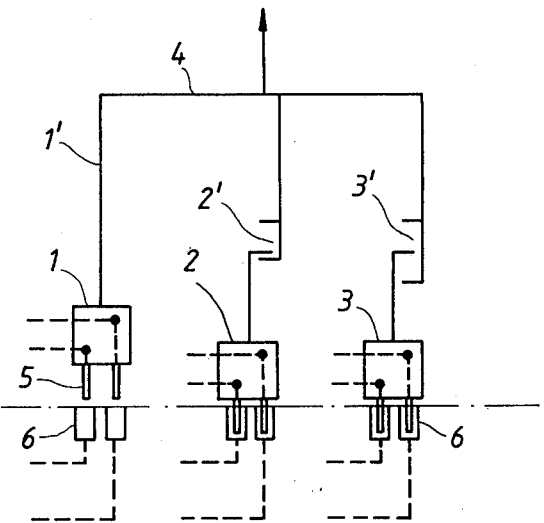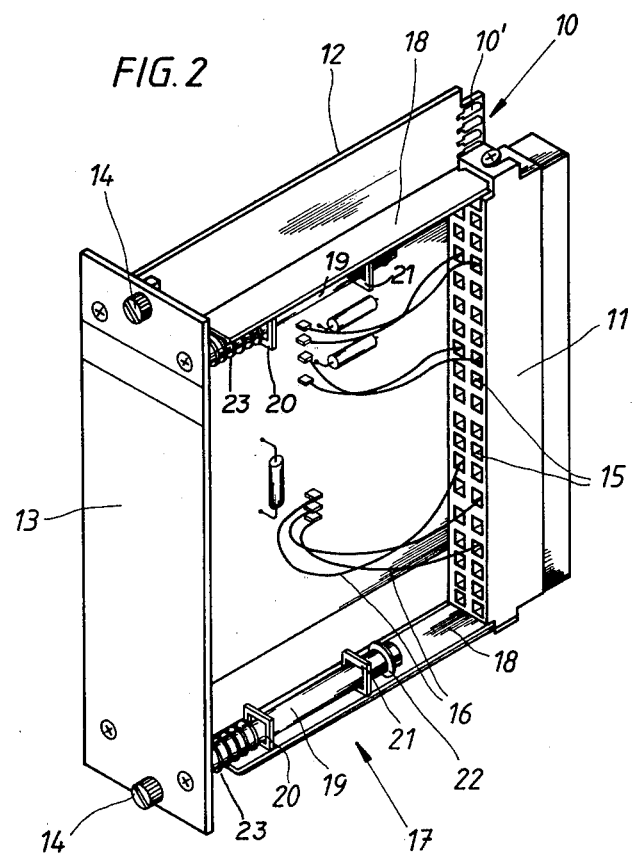

4,305,633

ELECTRICAL CIRCUIT MODULE WITH SEQUENTIALLY ACTUATED CONTACT APPARATUS

TECHNICAL FIELD

The present invention relates to an electrical circuit module of the plug-in type.

DISCLOSURE OF THE INVENTION

A construction according to the invention is designed to facilitate the insertion and of a plug-in circuit module, in which the number of contacts is very great, for example greater than forty. The contacts are inserted and withdrawn in sequential groups.

The scope of the invention will be clear from the appended claims.

BRIEF DESCRIPTION OF THE DRAWING

In the following the invention will be described in greater detail with reference to the accompanying schematic drawings, in which FIG. 1 illustrates a mechanical principle employed in the construction of a plug-in circuit module according to the invention, whereas FIG. 2 shows a perspective sketch of such a circuit module.

BEST MODE FOR CARRYING OUT THE INVENTION

In FIG. 1, numerals 1, 2 and 3 designate three movable, multiple contact devices, which are connected to a front support plate 4, or the like, of a plug-in circuit module. The movable contact devices 1, 2, 3 have multiple contact pins 5 intended for sockets 6 which are distributed among three socket groups, each corresponding to one movable contact device. The three socket groups may comprise three separate, fixed contact devices or different portions of one and the same fixed contact device. Electric wires are indicated in FIG. 1 by dashed lines. The movable contact devices 1, 2, 3 are connected to the front plate 4 via corresponding mechanical connections 1', 2', 3', of which connection 1' is free from play relative to front plate 4; whereas, connection 2' has a play relative to front plate 4 which is somewhat greater than the maximum withdrawal distance required to terminate an established electrical contact between a socket 6 and a pin 5. Further, the mechanical connection 3' has a play relative to front plate 4 which is twice as great as that of connection 2'. In the drawing, the front plate 4 has been moved back one-third of the distance required for withdrawing all contact devices. By the shown arrangement, the necessary withdrawal force has been reduced to one-third of what is required for simultaneous withdrawal of the three movable contact devices 1, 2, 3. Insertion force is similarly reduced.

In certain cases the force by which a pin 5 is retained in a socket 6 may decrease considerably with increasing withdrawal. It may then be sufficient to make the difference in play between a movable contact device made with a greater play and one made with a smaller play considerably smaller than the maximum distance of withdrawal of the latter contact device. Normally, however, the difference in play should be greater than 20%, preferably greater than 30%, of the maximum distance of withdrawal of the withdrawn contact device which is made with a smaller play.

The plug-in circuit module shown in FIG. 2 is intended to be arranged in a building frame (not illustrated) in such a manner that electrical components included in the plug-in circuit module are interconnected with electrical components in other circuit modules supported by the building frame by means of movable contact devices 10 and 11 present in the plug-in circuit module. A rectangular printed circuit board 12 is arranged perpendicular to and in a stiff mechanical connection with a front plate 13, which normally lies in a vertical plane. The front plate 13 is provided with two through-going screws 14 intended to fix the plug-in circuit module to the building frame. The screws 14 are so-called captured screws, which means that when they have been unscrewed from the building frame they may be used as handles when withdrawing the plug-in circuit module.

The contact device 10 comprises a printed circuit board portion, in which a plurality of contact parts 10' are fixed, but may also comprise a special contact device fixed to the circuit board. The contact device 11 may be undivided in the vertical direction, as shown in the drawing, or comprise a plurality of smaller contact devices arranged in a stiff connection with each other. The contact device 11 has a front side with a plurality of holes 15, each of which leading into a contact socket (not shown in the drawing) arranged in the contact device, said contact socket being intended to surround a corresponding contact pin in a contact device rigidly fixed to the building frame (not illustrated) and faced to the rear side of the contact device 11. A plurality of flexible and slack connecting wires 16 are provided in corresponding holes 15 and are each connected between a contact socket and connecting points of a plurality of circuits arranged on the printed circuit board 12 and intended for relatively high current and high voltage. These circuits are galvanically separated from a plurality of printed circuits made on the printed circuit board and intended for relatively low current and voltage values. These printed circuits for low current and voltage are connected via the contact device 10 to other circuits included in an electronics equipment.

The contact device 11 is mechanically connected to the front plate 13 by means of two elongated, rigid members 17 made with variable lengths, each of said members comprising a metal rail 18 attached to the contact device 11 and a metal rod 19 arranged parallel to said metal rail 18 and fixed to the front plate 13, said metal rod 19 being surrounded—with a small transversal play—by two frames 20 and 21 welded to the metal rail 18. When the illustrated plug-in circuit module is inserted into the building frame and the screws 14 are tightened, the member 17 has its minimum length. One end of the rail 18 is then in contact with the front plate 13. The longitudinal play (or "dead zone") of the member 17 is equal to the distance existing in this position between the frame 21 and a cuff ring 22 fixed to the rod 19. A pair of springs 23 surround rods 19 between frames 20 and front plate 13, so that contact device 11 is biased away from front plate 13 where the plug-in circuit module is removed from the building frame.

When the plug-in circuit module which is attached to the building frame is to be withdrawn, the screws 14 are loosened from their fixtures in the building frame, whereafter the force required for withdrawing the contact device 10 is applied to the plug-in circuit module, suitably by pulling the screws 14. At the same time as the front plate 13 is pulled away from the building frame, the contact parts 10' are correspondingly displaced with respect to corresponding contacts fixed to the building frame. The longitudinal play in each member 17 is so great that the front plate 13 has been drawn forwards by at least 4 millimeters with respect to its attached position and with respect to adjacent front plates belonging to other plug-in units which have not been withdrawn, before the withdrawing force can be transmitted to the contact device 11. It is then possible to get a steady grip directly onto the front plate and to use this grip for the remaining withdrawing movement. This is particularly advantageous when the necessary withdrawing force is greater at the contact device 11 than at the contact device 10, which is often the case. Each of the members 17 is preferably made with a longitudinal play which is greater than the withdrawal distance which, after having fully inserted the contact device 10, is required for complete withdrawal thereof.

We claim:

1. Plug-in circuit module for insertion into a building frame, said module comprising first movable contact device connected to a plurality of first low voltage and low current circuits, a second movable contact device connected to a plurality of second relatively high current and high voltage circuits, a front plate having a plurality of mounting screws for connecting the unit to a building frame, first mechanical connecting means for connecting said first movable contact device to said front plate, second mechanical connecting means for connecting said second movable contact device to said front plate, the play of said second mechanical connecting means in a direction perpendicular to said front plate, being greater than the play of said first mechanical connecting means in the same direction, said first movable contact device comprising a plurality of first contact parts, said second contact device comprising a plurality of second contact parts mounted in an elongated supporting body therefor, said second mechanical connecting means comprising two elongated members of variable length, which are fixed to said elongated supporting body and directed perpendicularly to said front plate, each of said elongated members comprising two parallel elongated parts which are arranged, within a limited range of movement, with mutual freedom of movement in the longitudinal direction of the member, said range of movement being limited in such a way that the minimum length of each of said members occurs when said front plate is attached to a building frame and said second movable contact device is in a correct contact position, whereas the maximum length of each of said members occurs when said front plate is withdrawn from its attached position, whereby said first movable contact devices are withdrawn at least partially, before said second movable contact devices are withdrawn at all.

2. A circuit module according to claim 1, wherein said maximum length of said members occurs when said front plate is withdrawn by at least 4 millimeters from its attached position.

3. A circuit module according to claim 1, wherein said first and second circuits are included on a circuit board to which said first mechanical connecting means is connected.

4. A circuit module according to claim 1, wherein the difference in play between said first and second mechanical connecting means is greater than 20% of the maximally required distance for separating the first mechanical connecting means from the building frame.

* * * * *